United States Patent [19]
Shirato et al.

[11] Patent Number: 5,219,770
[45] Date of Patent: Jun. 15, 1993

[54] METHOD FOR FABRICATING A MISFET INCLUDING A COMMON CONTACT WINDOW

[75] Inventors: Takehide Shirato, Hiratsuka; Toshihiko Yoshida, Yokohama, both of Japan

[73] Assignee: Fujitsu Limited, Kanagawa, Japan

[21] Appl. No.: 559,448

[22] Filed: Jul. 26, 1990

Related U.S. Application Data

[63] Continuation of Ser. No. 912,163, Sep. 26, 1986, abandoned, which is a continuation of Ser. No. 674,250, Nov. 16, 1984, abandoned.

[30] Foreign Application Priority Data

Nov. 30, 1983 [JP] Japan .................. 58-225677

[51] Int. Cl.$^5$ .......................... H01L 21/336
[52] U.S. Cl. .......................... 437/40; 437/29; 437/57; 437/154; 437/187; 148/DIG. 106
[58] Field of Search ............ 437/40, 41, 44, 45, 437/187, 978, 56, 57, 58, 29; 148/DIG. 106, DIG. 102

[56] References Cited

U.S. PATENT DOCUMENTS

| | | | |
|---|---|---|---|
| 3,440,500 | 4/1969 | Coppen | 357/86 X |
| 3,713,911 | 1/1973 | Larkin et al. | 148/DIG. 102 |
| 3,801,886 | 4/1974 | Imaizumi et al. | 357/86 X |
| 3,943,550 | 3/1976 | Kinoshi et al. | 357/86 X |
| 3,947,866 | 3/1976 | Stellrecht | 148/DIG. 106 |
| 4,009,057 | 2/1977 | de Brebisson et al. | 437/978 |
| 4,035,826 | 7/1977 | Morton et al. | 357/42 |
| 4,213,140 | 7/1980 | Okabe et al. | 357/86 X |
| 4,394,674 | 7/1983 | Sakuma et al. | 357/86 X |
| 4,417,385 | 11/1983 | Temple | 437/29 |
| 4,513,309 | 4/1985 | Cricchi | 357/86 X |

FOREIGN PATENT DOCUMENTS 0109692 5/1984 European Pat. Off. .
2825433 12/1978 Fed. Rep. of Germany .
52-64283 5/1977 Japan .

OTHER PUBLICATIONS

Electronics, Apr. 26, 1971, p. 41.

Primary Examiner—T. N. Quach
Attorney, Agent, or Firm—Nikaido, Marmelstein, Murray & Oram

[57] ABSTRACT

A semiconductor device comprising a drain and source region formed in a semiconductor substrate is provided. In order to provide a semiconductor device having a high packing density of the circuit elements, the contact windows for the source region and substrate region are combined into one opening in the source region. A common contact region is formed in a portion of the contact window for the source region by doping opposite conductivity type impurities. The depth of the converted region is deep enough to extend to the substrate. By connecting the source region and the substrate region in the common contact hole, the positioning margin and the wiring for connecting them are unnecessary and thus, the packing density of the devices in the MIS IC is increased.

8 Claims, 6 Drawing Sheets

FIG.4D
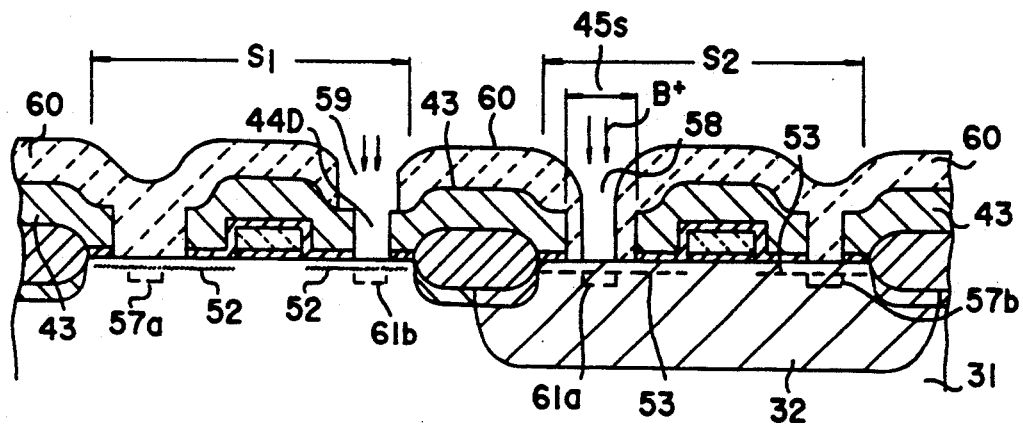
FIG.4E
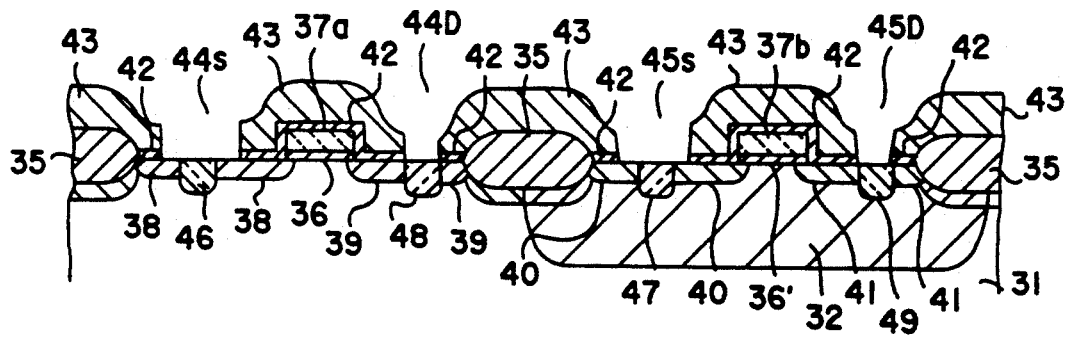
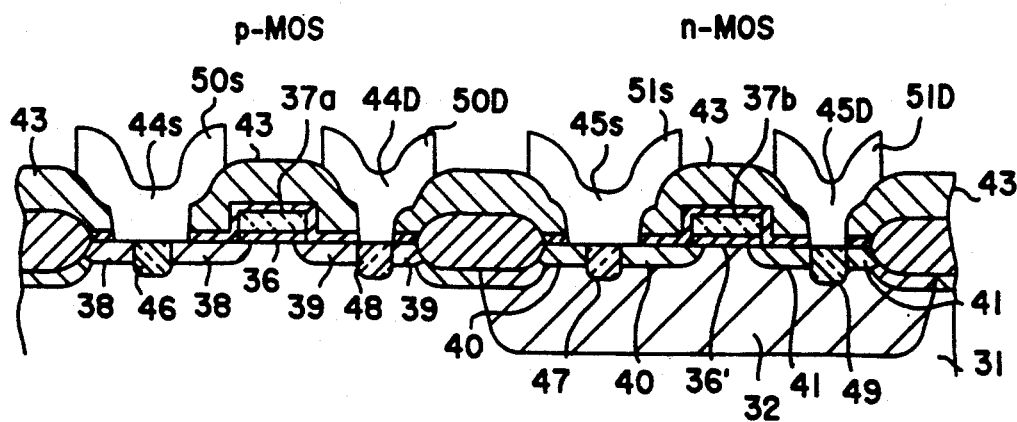
FIG.4F

METHOD FOR FABRICATING A MISFET INCLUDING A COMMON CONTACT WINDOW

This is a continuation of application Ser. Mo. 912,163, filed on Sep. 26, 1986 which is a continuation of Ser. No. 674,250 filed on Nov. 26, 1984 both abandoned.

BACKGROUND OF THE INVENTION

This invention is related to semiconductor devices and the fabricating method thereof, and in particular, it is related to the structure of metal insulator semiconductor (MIS) device and to fabricating a contact region for an electrode of MIS devices, for improving the packing density of the devices.

In a MIS device, it is important to obtain a good "ohmic contact" of the contact region, in order to attain high reliability of the semiconductor device. As the scale of integration of the semiconductor device increases, the total size and number of contact regions increases. The size of the contact region is related directly to the packing density of the semiconductor device. Therefore, it is essential to provide a structure and fabricating method which decreases the size and number of contact regions to attain a high integration density.

In the MIS integrated circuit (IC) device, the basic configurations of three-terminal field effect transistors (FET) are arranged in a common-source, and common-drain or common-gate connections in order to increase the packing density. In the basic common-source configuration, for example, the source regions of the MIS FETs are connected to a semiconductor substrate region or well region on which each MIS FET is fabricated through a wiring layer, and are kept at the same potential. In many cases, the semiconductor substrate is supplied with a reference voltage.

Generally, in a complementary metal oxide semiconductor (CMOS) IC, substrate contact regions and well contact regions are positioned one by one for each FET, and, each of the contact regions are connected to each electrode of the CMOS FET by metal wiring lines. However, a wiring line for each FET decreases the integration density of IC, and makes it difficult to fabricate.

A structure of a MIS FET fabricated in a conventional MIS IC is shown in FIGS. 1A-1C. FIG. 1A is a plan view of a prior art MIS FET, FIG. 1B is a sectional view along the line A—A in the FIG. 1A and FIG. 1C is a sectional view along the line B—B in the FIG. 1A.

Referring to the figures, the MIS FET has a semiconductor substrate 1. A source region 5 of the opposite conductivity type as the substrate 1, and a contact diffusion region 7 of the same conductivity type as the substrate 1 are formed on the substrate 1. Contact windows 10a, 10b, and 10c for each electrode are formed in insulating layers 8 and 9; wherein insulating layer 9 is phospho-silicate glass (PSG), 10a is a source electrode contact window corresponding to the source region 5, 10b is a drain electrode contact window corresponding to the drain region 6, and 10c is a substrate electrode contact window corresponding to the substrate contact region 7. The electrode contact windows are connected by a wiring layer, the source region 5 being connected to the substrate 1 by a wiring La. The potential of both the source region and the substrate is the same. Reference numeral 2 is a field oxide film, 3 is a gate oxide film, La is a metal wiring line for a reference voltage, Lb is a metal wiring line supplied with a voltage differ from the reference voltage.

In the prior art method for fabricating the MIS FET, it is necessary to provide a certain distant $d_A$ between gate electrode 4 and an $n^+$-type contact region 7 in order to provide for the width for $p^+$-type source region 5 and the margin for mask alignment. The width $W1_1$ of the $n^+$-type contact region 7 is necessary to have proper positioning margin $d_B$ so that electrode contact window 10c does not extend beyond the $n^{30}$-type contact region 7. Moreover, it is necessary that the electrode contact windows 10a and 10c have proper positioning margins $d_C$ and $d_D$ in order to maintain the separation between them.

According to the prior art, in order to provide such positioning margins ($d_B$, $d_C$ and $d_D$) for contact diffusion regions, the size of the contact region must be large. So, the integration density of the MIS IC is decreased.

SUMMARY OF THE INVENTION

It is an object of the present invention to provide a semiconductor device having a high packing density of circuit elements by improving the above-mentioned problems.

Another object of the present invention is to provide a structure of a MIS IC which can improve the packing density of the circuit elements.

A further object of the present invention is to provide a fabrication method thereof.

The foregoing objects are accomplished by combining the contact regions for the source region and the substrate region into a single contact window. The single contact window is formed as a part of the source region of each FET, and an impurity which has the same conductivity type as that of the substrate or well region on which the FET is fabricated, is doped with a high dose which is deep enough to reach the substrate or well region. Then the source region is electrically connected directly to the substrate or well region, so the positioning margin for each contact region is reduced, and moreover, the wiring for connecting them is eliminated. The packing density of the devices is thereby increased.

These and other objects will become apparent from the following detailed description taken in connection with the accompanying drawings.

BRIEF DESCRIPTION OF THE DRAWINGS

FIGS. 4A to 4F illustrate schematically the steps in the method of fabrication for a semiconductor device of the present invention.

Same or like reference numerals denote the same or like parts through the drawings.

DESCRIPTION OF THE PREFERRED EMBODIMENTS

Figure 2A:
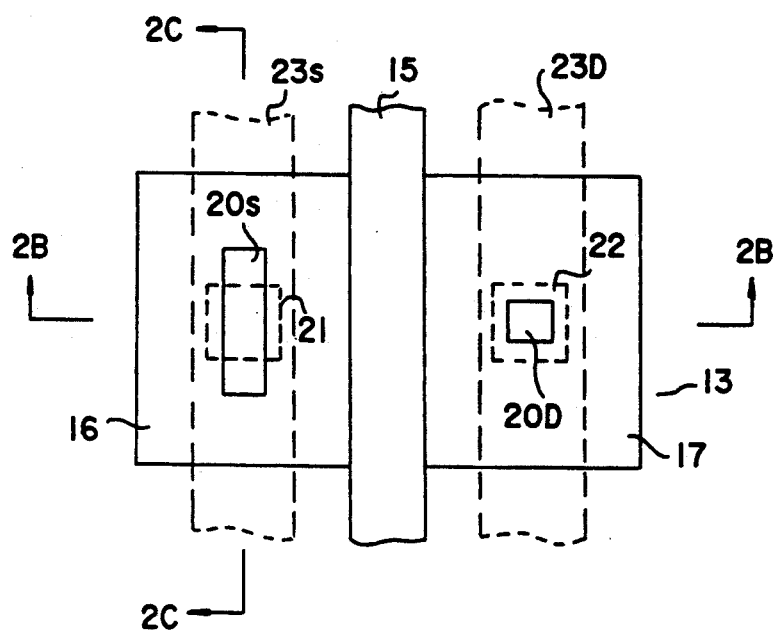
FIG. 2A is a schematic plan view of a pattern layout of a p-channel MOS FET of a first embodiment of the present invention.
Figure 2B:
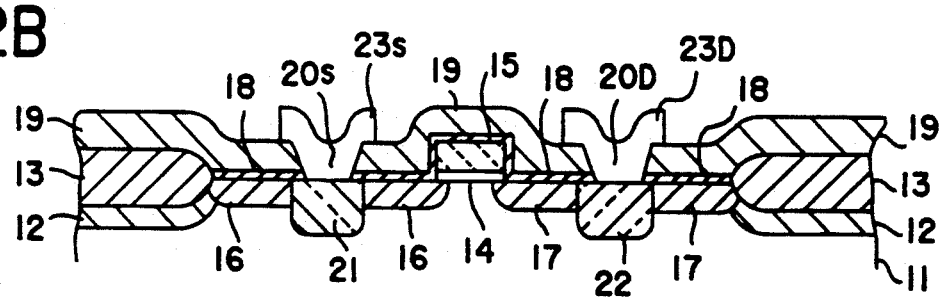
FIG. 2B is a schematic cross-sectional view taken along the line A—A in the FIG. 2A.
Figure 2C:
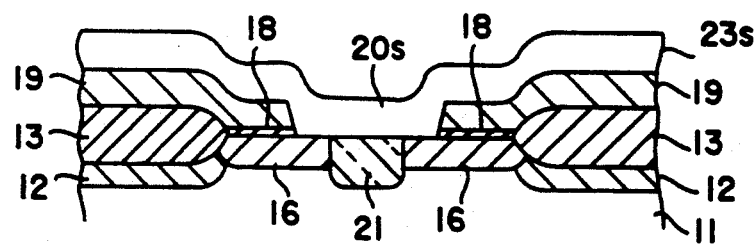
FIG. 2C is a schematic cross-sectional view taken along the line B—B in the FIG. 2A.

FIG. 2A is a schematic plan view of a pattern layout of a p-channel MOS FET (p-MOS) of a first embodiment of the present invention. FIG. 2B is a schematic cross-sectional view taken along the line A—A in the FIG. 2A and FIG. 2C is a schematic cross-sectional view taken along the line B—B in the FIG. 2A.

Figure 1A:
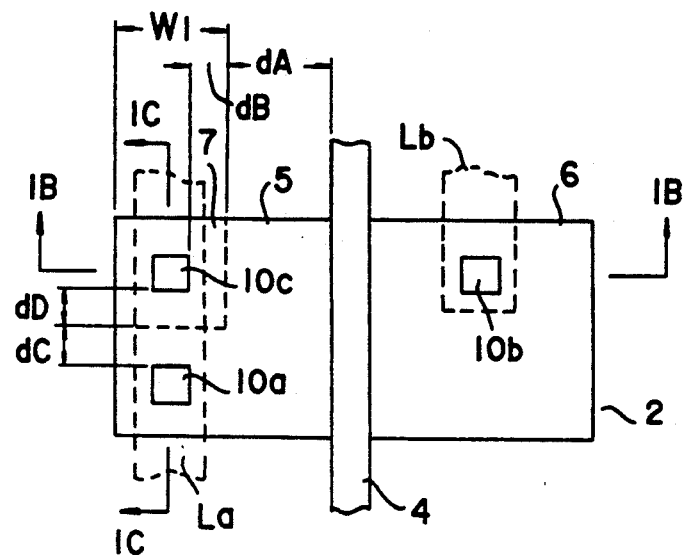
FIG. 1A is a schematic plan view of a pattern layout of a prior art semiconductor device.
Figure 1B:
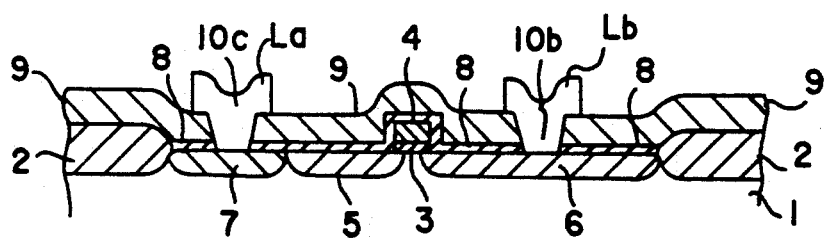
FIG. 1B is a schematic cross-sectional view taken along the line A—A in the FIG. 1A.
Figure 1C:
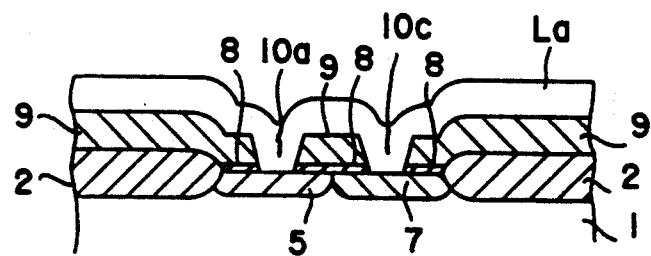
FIG. 1C is a schematic cross-sectional view taken along the line B—B in the FIG. 1A.

Compared to the prior art structure of the FIG. 1, the present invention combines the contact region for the source region and the substrate region using a single hole, and includes a margin space for alignment without requiring a special margin space.

A p-channel MOS FET is taken as an example to explain the present invention. A contact window $20s$ for a $p^+$-type source 16, hereinafter a common contact window, is formed with a rectangular form. Through the center part of the window $20s$, an n-type impurity is selectively doped into the $p^+$ source region 16, and the center part of the $p^+$-type source region 16 is converted to an $n^+$-type conductivity region 21 of high dose. As shown in the figure, the high dose region 21, because of diffusion, is wider than the area of $20s$. The detail of such diffusion will be disclosed below with respect to FIG. 5. The depth of this $n^+$-type substrate contact diffusion region 21 is deep enough to reach to the n-type substrate 11, and the $n^+$-type contact region 21 is formed in the center part of the contact window $20s$. When a common wiring line $23s$ is fabricated on the insulating layers of phospho-silicate glass (PSG) 19, as shown in the figures, the p -type source region 16 and $n^+$-type contact region 21 contact each other (FIG. 2C).

As a result, the $p^+$-type source region 16 is electrically connected to the contact region 21 which is electrically connected to $n^-$-type silicon substrate 11. Therefore, such regions are at the same potential despite the presence of a p-n junction between them, and they are connected to the common wiring line $23s$. A $p^{++}$-type diffusion region 22 is a $p^{++}$-type region compensated by an impurity formed at a part of the drain region 17 by diffusion through an opening $20_D$. The compensated diffusion is a conventional technique used widely to prevent a contact region from the shorting of a p-n junction between them. In particular, the compensated diffusion technique is useful to obtain a good "ohmic contact" of the contact region, in order to attain high reliability of the semiconductor device.

The impurity region of elements of a semiconductor device is usually formed by diffusing impurity material (dopant) into a specified region in a substrate, so this will be called the "diffusion region" hereafter.

In FIGS. 2A–2C, 12, 13, 14 are respectively an $n^+$-type channel cut region, a field oxide film, and a gate oxide film, and 15 is a polycrystalline silicon gate electrode. These are all used widely in conventional MOS devices, so the description is omitted for simplicity.

As described above, the contact windows for source region 16 and substrate region 21 are combined into one opening common contact window $20s$. Compared to the prior art construction in FIG. 1, the wiring line from the source region to substrate region is omitted, and the positioning margin required for positioning each of the contact windows with respect to each region 16 or 21 becomes unnecessary. Therefore, the scale of integration of the semiconductor device is increased.

Figure 3A:
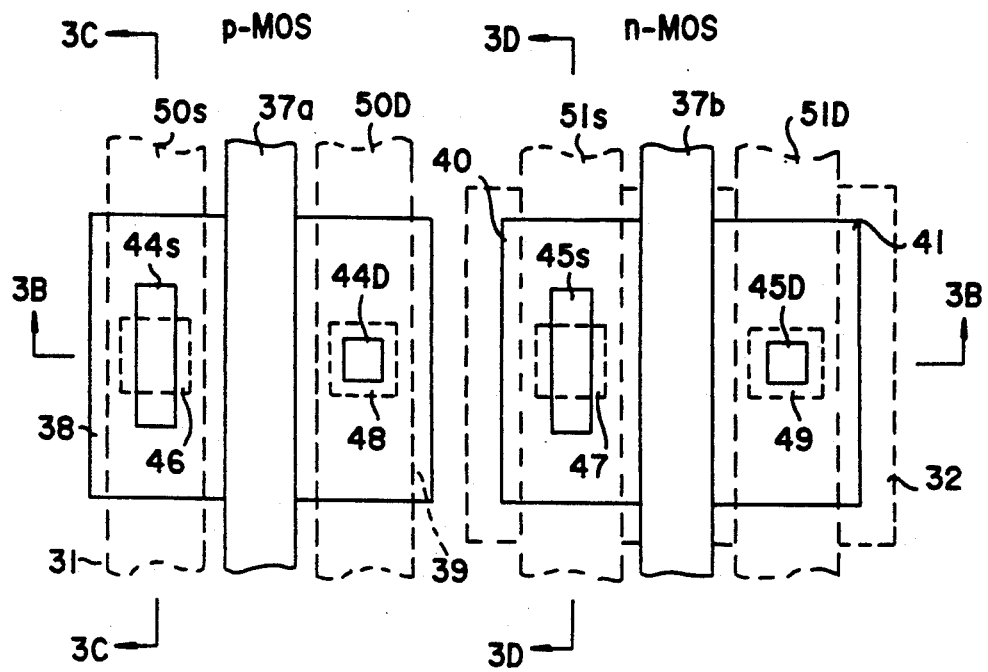
FIG. 3A is a schematic plan view of a pattern layout of a CMOS FET of a second embodiment of the present invention.
Figure 3B:
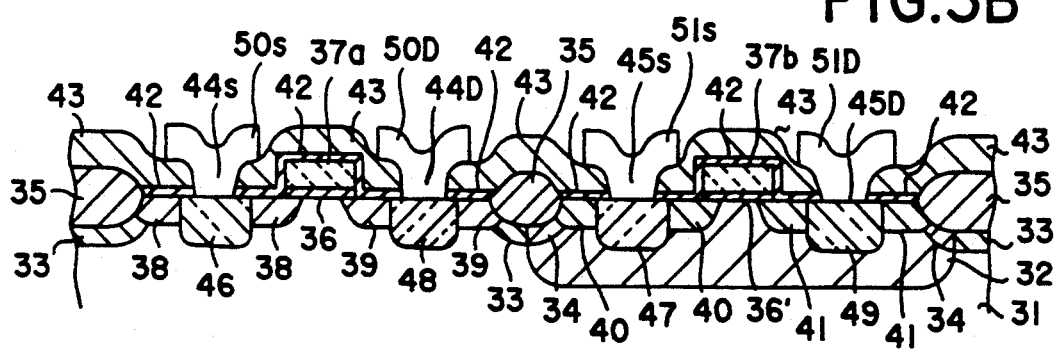
FIG. 3B is a schematic cross-sectional view taken along the line A—A in the FIG. 3A.
Figure 3C:
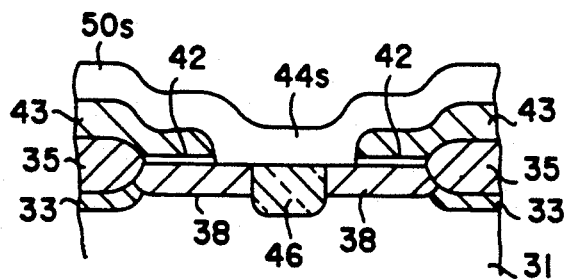
FIG. 3C is a schematic cross-sectional view taken along the line B—B in the FIG. 3A.
Figure 3D:
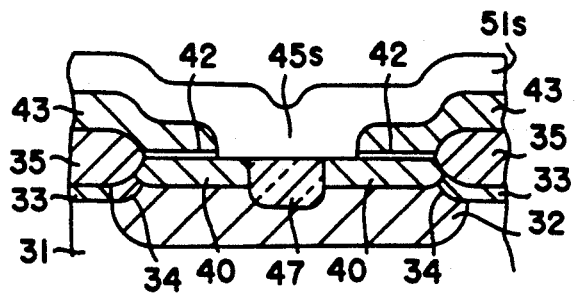
FIG. 3D is a schematic cross-sectional view taken along the line C—C in the FIG. 3A.

FIG. 3A is a schematic plan view of a pattern layout of a CMOS FET of a second embodiment of the present invention which includes a complementary metal oxide semiconductor (CMOS) structure, FIG. 3B is a schematic cross-sectional view taken along the line A—A in the FIG. 3A, FIG. 3C is a schematic cross-sectional view taken along the line B—B in the FIG. 3A and FIG. 3D is a schematic cross-sectional view taken along the line C—C in the FIG. 3A.

In FIGS. 3A–3D, reference numeral 31 is an $n^-$-type silicon substrate, 32 is a p-type well region, 33 is an $n^+$-channel cut region, 34 is a $p^+$-channel cut region, 35 is a field oxide film, 36 is a gate oxide film, and 37a and 37b are polycrystalline silicon gate electrodes. 38 is a $p^+$-type source region, 39 is a $p^+$-type drain region, 40 is an $n^+$-type source region, 41 is an $n^+$-type drain region, 42 is an oxide film for impurity material blockade, and 43 is an insulating layer of phospho-silicate glass (PSG). $44_D$ and $45_D$ are an electrode contact window for drain region, 46 is a contact region for $n^+$-type substrate, 47 is a contact region for $p^+$-type well, 48 is a $p^{++}$-type compensation diffusion region, 49 is an $n^{++}$-type compensation diffusion region, $50_D$ is a drain wiring layer of p-MOS and $51_D$ is a drain wiring layer of n-MOS. The substrate region 31 and well region 32 of the elements of a semiconductor device are usually formed by diffusing impurity material (dopant) to a specified region in a substrate, so this will be called the "semiconductor body" hereafter.

In a p-MOS in the CMOS FET, as shown in FIGS. 3A to 3D, a rectangular electrode contact window $44s$ is formed on a source region 38 of the p-MOS. An n-type impurity material of high concentration is selectively doped into a center part of the contact window $44s$, which produces a conversion region and an $n^+$-type substrate contact region 46 is selectively formed.

The contact region reaches into the region of the $n^-$-type silicon substrate 31. The selective doping is performed in a similar manner as described with respect to FIG. 2. The details of this selective doping will be described later with respect to FIG. 5.

Similarly, in an n-MOS in the CMOS FET, a rectangular common contact window $45s$ is formed in a source region 40 of the n-MOS. A p-type impurity material of high concentration is selectively doped into a portion+of the $n^+$-type source region 40 in a similar manner which will be described later. As a result, a conversion region is produced and $p^+$-type well contact diffusion region 47 is selectively formed. The region 47 reaches into the region of a p-type well region 32.

As shown in FIGS. 3A to 3D, the $p^+$-type source region 38 is connected to the $n^+$-type substrate contact region 46 which is electrically connected to the $n^-$-type silicon substrate 31. As a result, these regions are held at the same potential by the common wiring line 50s despite the presence of a p-n junction between them.

Similarly, the n+-type source region 40 is connected to the p+-type well contact region 47 which is electrically connected to the p-type well region 32. As a result, these regions are held at the same potential by the common wiring line 51s.

In the present invention, the common contact windows for the source region and substrate region are combined as described into a single window, so as compared to prior art construction in the FIG. 1, the wiring line from the source region to substrate region is omitted, and the margin required for contact windows can be neglected. Therefore, in the present invention, the scale of integration of the semiconductor device is increased.

Next, the process for fabricating the device by the present invention will be disclosed.

FIGS. 4A to 4F illustrate schematically the steps in the fabrication method of the semiconductor device of the present invention. The elementary processing methods used such as etching, insulating layer formation, aluminum sputtering, lithographic technology etc. are conventional and well known in the art and, therefore, the detailed description regarding this technology is omitted in the following disclosure.

Figure 4A:
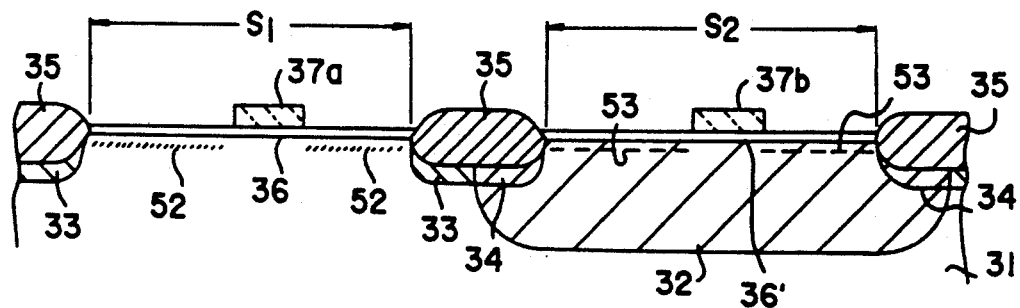

In FIG. 4A, reference numeral 33 is the n+-channel cut region. 34 is the p+-channel cut region and 35 is the field oxide film. These are all well known and widely used technology in the art. Using conventional processing such as thermal oxidation, a gate oxide film 36 is formed in a silicon substrate 31 which is a p-MOS FET region $S_1$. Similarly, at the same time, the gate oxide film 36' is formed on the p-type well region 32 which will become an n-MOS FET region $S_2$. The polycrystalline silicon gate electrodes 37a and 37b are formed on the gate oxide film. They are fabricated using a conventional method such as chemical vapor deposition (CVD) and patterned by a photolithography. Using the gate electrode 37a or 37b as a mask, boron (B), a dopant material, is selectively ion-implanted in the n−type silicon substrate 31 through the gate oxide layer 36. Similarly, arsenic (As), a dopant material, is selectively ion-implanted into the p-type well region 32. The doping density of boron and arsenic are both in the range of approximately $1 \times 10^{15}$ (atm/cm$^2$) to $4 \times 10^{15}$ (atm/cm$^2$). As a result, a first boron (B) doped region 52 and a first arsenic (As) doped region 53 are formed.

Figure 4B:
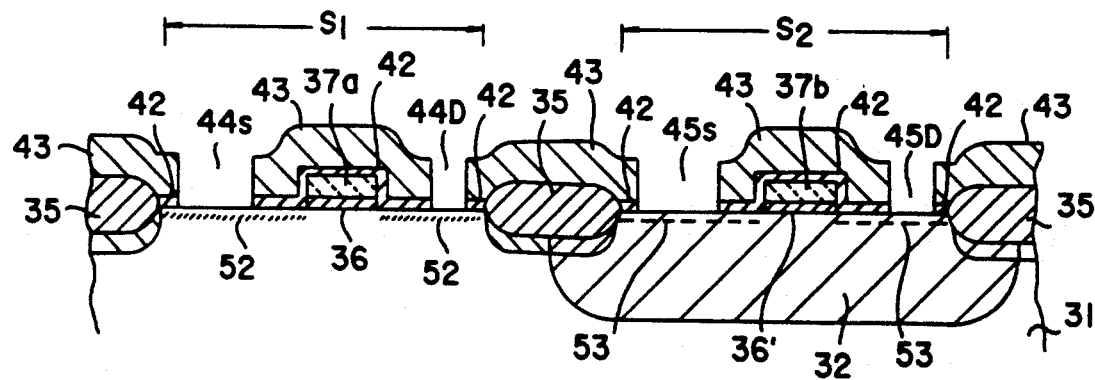

FIG. 4B illustrates a fabrication method for the common contact windows 44s and 45s, and the drain electrode contact windows 44$_D$ and 45$_D$.

Using conventional photolithographic technology, as shown in the FIG. 4B, the gate oxide film 36 is removed, and a thin oxide layer 42 is formed again over the entire substrate by a conventional thermal oxidizing method. This oxide layer 42 is used to block the impurity materials. Next, the phosphosilicate glass (PSG) insulating layer 43 is formed over the entire substrate. The common contact windows 44s and 45s, at the sources of the p-MOS FET and the n-MOS FET respectively, and the drain electrode contact windows 44$_D$ and 45$_D$ are then formed. In order to give a better understanding, the layout of the common contact windows 44s and 45s as shown in the figures hereinafter, FIGS. 3C and 3D illustrate the device rotated 90° from the original orientation.

Figure 4C:
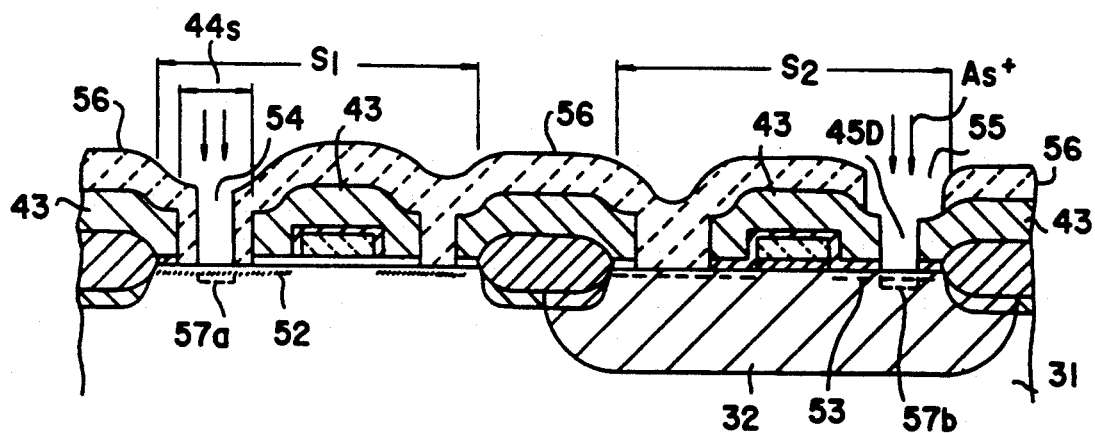

FIG. 4C illustrates the fabrication method of the formation of phosphorus (P) doped region 57a or 57b. The first resist pattern 56 is formed on the substrate, and patterned to have the openings 54 and 55. The opening 54 is narrower than the opening 44s, and the opening 55 is wider than the opening 45$_D$. The effect of the difference of these openings are effective for the mask alignment which will be described later with respect to FIG. 5. By using the resist pattern 56 as a mask, phosphor (P) is selectively ion-implanted into the n−type silicon substrate 31 and into the p-type well 32 through the openings 54 and 45$_D$. The doping density is in the range of approximately $5 \times 10^{15}$ to $1 \times 10^{16}$ (atm/cm$^2$) and the acceleration voltage is 70 to 180 (KeV).

As a result, phosphorus (P) doped region 57a is formed, which is a deeper doped region than the boron doped region 52. At the same time, a phosphorus (P) doped region 57b is formed, which is a deeper doped region than the arsenic (As) doped region 53.

Figure 5:
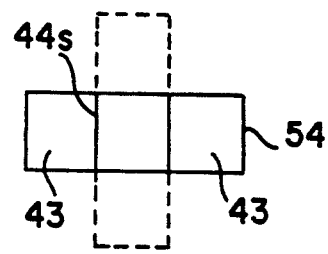
FIG. 5 is a schematic plan view of a resist pattern for opening windows of the contact region which provides the margin for alignment.

FIG. 5 is a schematic plan view of showing the relation between the opening 54 on the first resist pattern and the opening 44s on the PSG layer 43. Since the openings are arranged orthogonally with respect to each other, the opening corresponding to FIG. 2A is formed at the cross point of the openings. As can be seen in the figure, both the openings 54 and 44s have a length which is greater than the tolerance of the mask, and the alignment is quite easy. The opening 55 for the drain opening 45$_D$ also has enough margin for mask alignment.

Referring back to FIG. 4, FIG. 4D illustrates the fabrication method for the formation of boron doped region 61a or 61b. The first resist pattern 43 is removed and the second resist pattern 60 is formed on the substrate and patterned to have the openings 44$_D$ and 45s. The opening 44$_D$ is narrower than the opening 59, and the opening 45s is wider than the opening 58. The effect of the difference of these openings is effective for mask alignment in a manner similar to that which has been described with respect to FIG. 5. By using this resist mask 60 as a mask, boron (B) is selectively ionimplanted in the p-type well region 32. The doping density is in the range of approximately $5 \times 10^{15}$ to $1 \times 10^{16}$ (atm/cm$^2$) and the acceleration voltage is 70 to 180 (KeV).

As a result, the second B doped region 61a is formed, which is a deeper doped region than the first arsenic (As) doped region 53. At the same time, the second boron (B) doped region 61b has a deeper diffusion region than the first boron (B) doped region 52. The second dopant thus has a higher concentration than the first dopant, and the depth of the second doped region is deeper than the depth of the first doped region and reaches into the substrate or well region.

FIG. 4E illustrates an activation process. In FIG. 4E, the second resist pattern 60 is removed from the substrate. Annealing is performed at a temperature of about 950° C. for 30 minutes in order to activate the doped impurity material (dopant). The doped impurity materials are diffused into the regions; the p+-type source region 38, the p+-type drain region 39, the n+-type source region 40, the n+-type drain region 41, the n+-type substrate contact diffusion region 46, the p+-type well contact diffusion region 47, the p++-type compensate diffusion region 48 and the n++-type compensate diffusion region 49 are formed as shown.

Figure 6A:
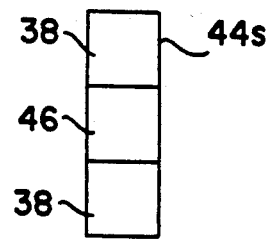
FIGS. 6A and 6B are schematic plan views of an opening of contact region for a source electrode which provides margin for alignment.
Figure 6B:
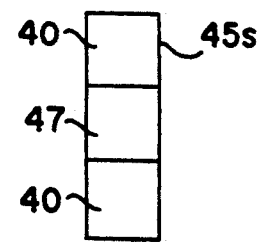

In the process of the FIG. 4E, both the surface of the n+-type substrate contact diffusion region 46 and the p+-type source region 38 are exposed in the common contact window 44s as shown in FIG. 6A. A surface of the p+-type compensate diffusion region 48 is exposed in the drain electrode contact window 44$_D$. In the common contact window 45s of the n-MOS FET, both the surface of the p+-type well contact diffusion region 47 and the n+-type source region 40 are exposed as shown in FIG. 6B. The n++-type compensate diffusion region 49 is exposed in the drain electrode contact windows 45$_D$. In the figures, the direction of FIGS. 6A and 6B are arranged in the same direction to that of FIG. 3A.

FIG. 4F illustrates the fabrication process of the wiring. In FIG. 4F, conventional sputtering and lithographic processes are used. The common wrring 50s of p-MOS FET is formed covering the common contact window 44s connecting both the surface of the n+-type substrate contact region 46 and the p+-type source region 38. Generally, aluminum (Al) film is used for the wiring material. Similarly, the drain wiring 50$_D$ of p-MOS FET is formed in order to connect the drain electrode to the surface of the p+-type compensate diffusion region 48 through the contact window 44$_D$. The common wiring 51s of the n-MOS FET is formed over the common contact window 45s connecting p+-type source region 47 and n+-type source region 40. The drain wiring 51$_D$ for the n-MOS FET is formed to connect to the n++-type compensate diffusion region 49 through the electrode contact window 45$_D$. Finally, the entire surface of the substrate is coated with an insulating layer. As described above, the CMOS FET can be formed by no additional fabricating process for the IC.

According to the present invention, for example, the marginal distance ($d_A + d_B$) for the gate electrode and the common contact window is improved by 2 μm from that of 4 μm of the prior art. Similarly, the marginal distance ($d_C + d_D$) for the electrode contact window of the source region and the electrode contact window for the substrate is unnecessary, and the contact window (38 and 40 as shown in the FIG. 6) can advantageously be enlarged by 2 μm in the present invention, and the total reduction of the marginal distance of 2 μm is obtained. The decrease in marginal space is very large compared to the size of FETs. For example, the size of a FET used in a LSI is approximately 11 μm × 8 μm. Therefore, it will be understood the reduction of 2 μm has a large influence in the packing density of the device. That means the size of an elementary device is decreased about 20% in area. It will be clear that by using such small size element, the packing density of IC can be increased to a greater extent.

In the above disclosure, the ion-implantation has been used for the doping of the impurities, but it can be replaced by any kind of process, such as diffusion.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. A method for fabricating a MISFET, comprising the steps of:

(a) forming a first doped region on the surface of a semiconductor body, said first doped region on the surface of a semiconductor body, said first doped region forming a source and a drain region of said MISFET, said first doped region having an opposite conductivity type to that of said semiconductor body;

(b) forming an insulator film on the surface of said semiconductor body;

(c) forming a common contact window on said insulator film at a position of said source region and forming a drain electrode contact window on said insulator film at a position of said drain region;

(d) covering said surface with a first resist film and patterning said first resist film to form a first opening therein, said first opening exposing a part of said common contact window;

(e) forming a second doped region on the surface of said semiconductor body by doping through said first opening, said second doped region having the same conductivity type as said semiconductor body, wherein a depth of said second doped region is deeper than a depth of said first doped region;

(f) removing said first resist and exposing said first and second doped regions in said common contact window;

(g) covering said surface with a second resist film and patterning said second resist film to form a second opening therein, said second opening exposes entirely said drain electrode contact window;

(h) forming a third doped region in said semiconductor body by doping through said second opening, said third doped region having the opposite conductivity type to said semiconductor body, wherein a depth of said third doped region is deeper than the depth of said first doped region; and (i) forming common wiring layer and drain wiring layer, through said common contact window and said drain electrode contact window, respectively, said common wiring layer is in contact with said source region and said second doped region and said drain wiring layer is in contact with said third doped region.

2. A method for fabricating a semiconductor device according to claim 1, wherein steps (a) and (e) are carried out by ion-implantation and the dose rate of the ion-implantation for the step (e) is larger than that for step (a).

3. A method for fabricating a semiconductor device according to claim 1, wherein said substrate is a silicon substrate and said insulator film formed in the step (b) is a phospho-silicate glass film.

4. A method for fabricating a semiconductor device according to claim 3, wherein steps (a) and (e) are respectively performed by ion-implantation and a subsequent annealing process.

5. A method for fabricating a CMISFET, comprising 1) a first MISFET with an opposite conductivity type channel to a semiconductor body which is formed at a surface of a first region of the semiconductor body, and 2) and second MISFET with a same conductivity type channel as the semiconductor body at a surface of a well with opposite conductivity type to the semiconductor body which is formed adjacent to said first region of the semiconductor body, through an isolation region, said method comprising the steps of:

(a) forming a first doped region on a surface of said first region of said semiconductor body, said first doped region forming source and drain regions of said first MISFET, said first doped region having an opposite conductivity type to that of said semiconductor body, and forming a second doped region on the surface of said well, said second doped region forming source and drain regions of said second MISFET, said second doped region having an opposite conductivity type to that of said well;

(b) forming an insulator film on the surface of said semiconductor body;

(c) forming a common contact window and a drain electrode contact window on said insulator film, corresponding to positions of said source and drain regions of said first and second MISFETs, respectively;

(d) covering said surface with a first resist film and patterning said first resist film to form first and second openings therein, said first opening exposes a part of said common contact window for said source region of said first MISFET and said second opening exposes entirely said drain electrode contact window for said drain region of said second MISFET;

(e) forming a third doped region in said semiconductor body by doping through said first and second openings, said third doped region having the same conductivity type as said semiconductor body, wherein a depth of said third doped region is deeper than a depth of said first and second doped regions;

(f) removing said first resist film and exposing said first and third doped regions in said common contact window for said source region of said first MISFET and entirely exposing said third doped region in said drain electrode contact window for said drain region of said second MISFET;

(g) covering said surface with a second resist film and patterning said second resist film to form third and fourth openings therein, said third opening exposes a part of said common contact window for said source region of said second MISFET and said fourth opening exposes entirely said drain electrode contact window for said drain region of said first MISFET;

(h) forming a fourth doped region in said semiconductor body by doping through said third and fourth openings, said fourth doped region having the opposite conductivity type as said semiconductor body, wherein a depth of said fourth doped region is deeper than the depth of said first and second doped regions; and (i) forming common wiring and drain wiring through said common contact windows and said drain electrode contact windows, respectively, said common wiring is in contact with said source region and third doped region of said first MISFET and is in contact with said source region and fourth doped region of said second MISFET, said drain wiring is in contact with said fourth doped region of said first MISFET and is in contact with said third doped region of said second MISFET.

6. A method for fabricating a semiconductor device according to claim 5, wherein:

said substrate consists of n-type silicon and said well region consists of p-type silicon;

the first dopant used in the step (a) is boron (B); and the second dopant used in the step (e) is phosphorus (P).

7. A method for fabricating a semiconductor device according to claim 5, wherein:

said substrate consists of n-type silicon and said well region consists of p-type silicon;

the first dopant used in the step (a) is arsenic (As); and the second dopant used in the step (e) is boron (B).

8. A method for fabricating a semiconductor device according to claim 6, wherein:

the acceleration voltage of the dopant for the steps (a) and (e) is in the range of 70 to 180 (KeV); and the device is annealed for about 30 minutes at a temperature of approximately 950° C.

* * * * *